(12) United States Patent
Otsuki (10) Patent No.: US 6,501,128 B1
(45) Date of Patent: Dec. 31, 2002

(54) INSULATED GATE TRANSISTOR AND THE METHOD OF MANUFACTURING THE SAME

(75) Inventor: Masahito Otsuki, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/610,052

(22) Filed: Jul. 5, 2000

(30) Foreign Application Priority Data

Jul. 5, 1999 (JP) ............................................ 11-189891

(51) Int. Cl.[7] ........................ H01L 27/108; H01L 29/76
(52) U.S. Cl. .................... 257/330; 257/332; 257/335; 257/336; 257/339; 257/341; 257/342; 257/343
(58) Field of Search ................... 257/330, 332, 257/335, 336, 339, 341, 342, 343

(56) References Cited

U.S. PATENT DOCUMENTS

| | | | |
|---|---|---|---|
| 4,672,407 A | | 6/1987 | Nakagawa et al. ......... 357/23.4 |
| 4,990,975 A | * | 2/1991 | Hagino ....................... 357/23.4 |
| 5,151,762 A | * | 9/1992 | Uenishi et al. ............. 357/23.4 |
| 5,173,435 A | * | 12/1992 | Harada ........................ 437/31 |
| 5,250,449 A | * | 10/1993 | Kuroyanagi et al. .......... 437/40 |
| 5,378,911 A | * | 1/1995 | Murakami ................... 257/334 |
| 5,545,908 A | * | 8/1996 | Tokura et al. ............... 257/341 |
| 5,701,023 A | * | 12/1997 | Bulucea et al. ............. 257/341 |
| 5,914,503 A | * | 6/1999 | Iwamuro et al. ............. 257/133 |
| 6,037,628 A | * | 3/2000 | Huang ......................... 257/329 |
| 6,169,299 B1 | * | 1/2001 | Kawaji et al. ............... 257/137 |
| 6,238,980 B1 | * | 5/2001 | Ueno .......................... 438/268 |
| 6,303,410 B1 | * | 10/2001 | Baliga ........................ 438/138 |

FOREIGN PATENT DOCUMENTS

EP  0 336 393 A2  10/1989

* cited by examiner

Primary Examiner—Allan R. Wilson
Assistant Examiner—Joseph Nguyen
(74) Attorney, Agent, or Firm—Rossi & Associates (57) ABSTRACT

An IGBT that exhibits a low on-voltage and a sufficient short circuit withstand capability and to provide a method of manufacturing such an IGBT. The p-type well region and the n-type emitter region are not formed by the self-alignment technique using the gate electrode as a common mask but by distributing the impurity ions using masks, the edges thereof being displaced for an offset length, by that the channel region is widened. The preferable offset length d is from 0.5 to 5.0 μm.

2 Claims, 12 Drawing Sheets

INSULATED GATE TRANSISTOR AND THE METHOD OF MANUFACTURING THE SAME

FIELD OF THE INVENTION

The present invention relates to an insulate gate transistor that has an insulated gate structure formed of a metal layer, an oxide layer and a semiconductor layer.

BACKGROUND

Figure 10:
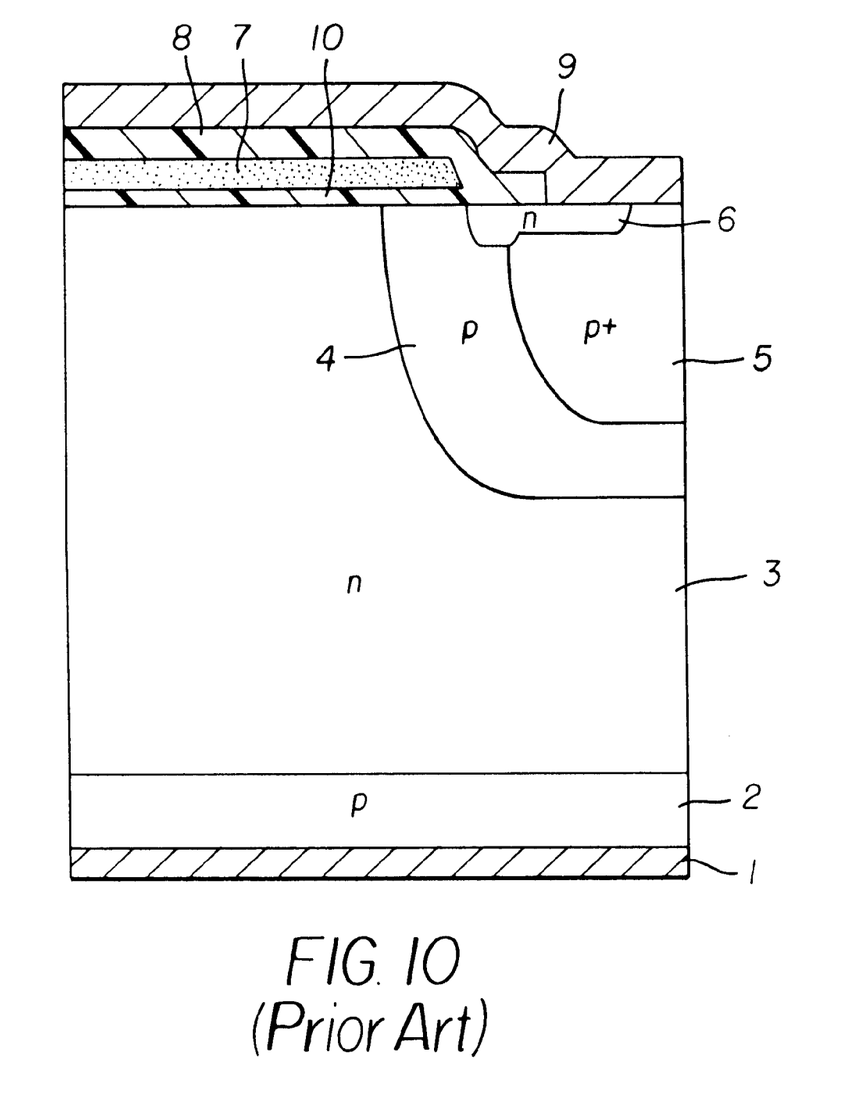
FIG. 10 is a cross sectional view of the unit structure (half cell) of a conventional insulate gate bipolar transistor.
Figure 11A:
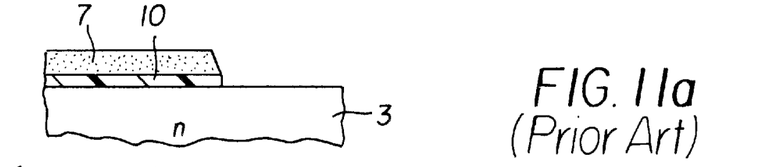
FIGS. 11(a)–11(f) shows cross sectional views explaining the steps 11(a) through 11(f) for manufacturing the IGBT of FIG. 10.
Figure 11B:
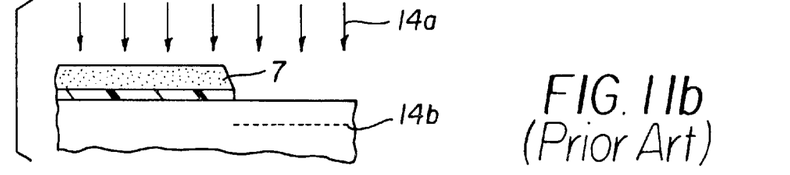
Figure 11C:
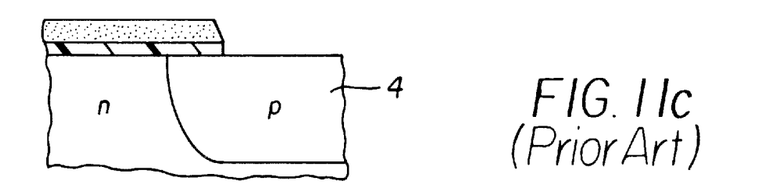
Figure 11D:
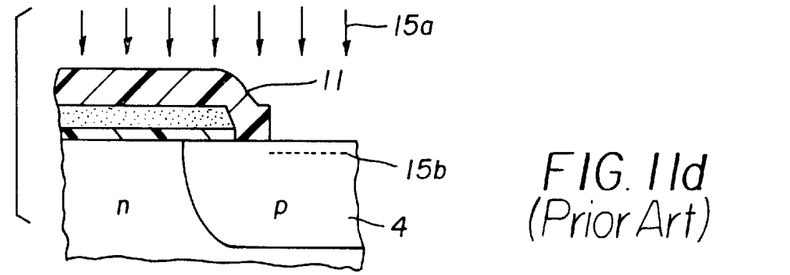
Figure 11E:
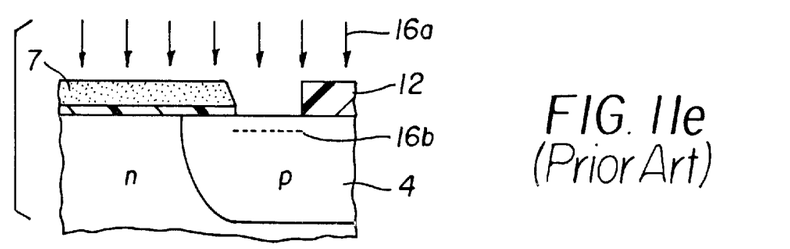
Figure 11F:
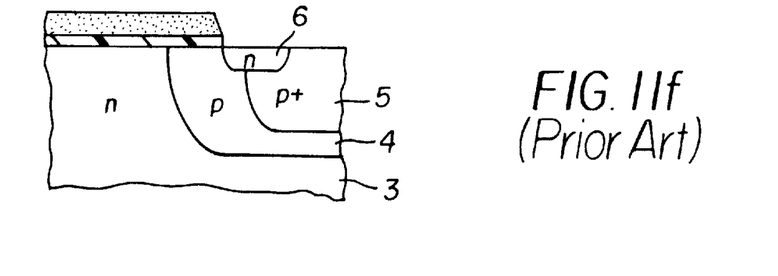

FIG. 10 is a cross sectional view of the unit structure (the so-called "half cell") of a conventional insulate gate bipolar transistor (hereinafter referred to as an "IGBT"), that is a type of insulate gate transistor. Referring now to FIG. 10, a p-type well region 4 is in the surface portion of an n-type drift layer 3. A heavily doped p$^+$-type contact region 5 is in p-type well region 4. An n-type emitter region 6 is in the surface portions of p-type well region 4 and p$^+$-type contact region 5. A gate electrode 7 is above the semiconductor structure with a gate oxide film 10 interposed therebetween from n-type emitter region 6 to n-type emitter regions 6 of the adjacent unit structure. An emitter electrode 9 is in common contact with n-type emitter region 6 and p$^+$-type contact region 5. A collector layer 2 is on the back surface of n-type drift layer 3. A collector electrode 1 is on the back surface of collector layer 2. Emitter electrode 9 is extended above gate electrode 7 with an interlayer insulation film 8 interposed therebetween.

FIG. 11 shows cross sectional views explaining the steps 11(a) through 11(f) for manufacturing the IGBT of FIG. 10. In FIG. 11, only the emitter side of the IGBT is shown for the sake of simplicity. Referring now to the cross section (a) of FIG. 11, a thin gate oxide film 10 is formed on n-type drift layer 3 by thermal oxidation. A polycrystalline silicon film is deposited on gate oxide film 10, and a gate electrode 7 is formed by patterning the deposited polycrystalline silicon film by photolithography. As shown in FIG. 11(b), boron ions 14a are selectively implanted using gate electrode 7 as a mask. The implanted boron atoms are designated by a reference numeral 14b. Referring now to FIG. 11(c), a p-type well region 4 is formed by activating implanted boron atoms 14b by a heat treatment. Boron ions 15a are selectively implanted using a patterned photoresist 11 as a mask for the ion implantation as shown in FIG. 11(d). The implanted boron atoms are designated by a reference numeral 15b. Referring now to FIG. 11(e), arsenic ions 16a are implanted using gate electrode 7 and a patterned photoresist 12 as masks for the ion implantation. The implanted arsenic atoms are designated by a reference numeral 16b. As shown in FIG. 11(f), p$^+$-type contact region 5 and n-type emitter region 6 are formed by activating the implanted boron atoms 15b and the implanted arsenic atoms 16b by a heat treatment. According to the manufacturing method described above, p-type well region 4 and n-type emitter region 6 are self-aligned by ion implantation using the same gate electrode 7 as a mask for defining one end of p-type well region 4 and one end of n-type emitter region 6.

In the IGBT exhibiting the breakdown voltage of the 600 V class, p-type well region 4 is 4 μm in depth, p$^+$-type contact region 5 is 3 μm in depth, and n-type emitter region 6 is 0.3 μm in depth. And, the width of the surface portion of p-type well region 4 between n-type emitter region 6 and n-type drift layer 3, that is the channel length, is about 1 μm.

Recently, the diffusion depth of the p-type well region has become reduced to reduce the loss of the IGBT (cf. M. Otsuki, et. al., "The 3rd generation IGBT toward a limit of IGBT performance", Proc. ISPSD '93, pp. 24–29, (1993), and T. Kushida, et. al., "A He irradiated IGBT with a shallow p-base and shallow FLRs", Proc. ISPSD '97, pp. 277–280, (1997)).

However, when the diffusion depth of the p-type well region is limited to be shallow, the lateral diffusion length is shortened, resulting in a shortened channel length. Due to the shortened channel length, the current caused by short-circuiting of the load (load short-circuit current) is increased and, therefore, the short circuit withstand capability of the device is reduced.

Various countermeasures have been proposed to obviate the above described problem and to secure a certain short circuit withstand capability. The proposed countermeasures include patterning the emitter structure for shortening the channel length in the MOS structure (cf. Akio Nakagawa, DE 3 519 389 A1) and combining n-type and n$^+$-type impurity distributions for forming the emitter region (J. Zeng, et. al., "Design of IGBTs for Latch-up Free Operation", Solid State Electronics vol. 37, No. 8, pp. 1471–1475, (1994), and Kenji Suzuki, EP 0 336 393 A2).

The countermeasures described above, however, obtain a sufficient short circuit withstand capability at the sacrifice of on-state voltage drop of the device. Although the electrons injected into the n-type drift layer of the IGBT may be controlled, the above described countermeasures are not so effective to improve the latch-up withstand capability of the npn transistor formed of an n-type emitter region, a p-type well region and an n-type drift layer. Due to the unimproved latch-up withstand capability, it is impossible to prevent the parasitic npnp thyristor, formed of n-type emitter region 6, p-type well region 4, n-type drift layer 3 and p-type collector layer 2, from latching up.

In the ON-state of the IGBT, the injected electron current Id (in the saturation region) is expressed by the following equation.

$$Id = (Z/L)\mu Co(Vg-Vth)^2 \qquad \text{Eq. (1)}$$

Here, Z is the circumferential length of the channel region, L the channel length, Co the gate capacitance, Vg the gate voltage and Vth the threshold value.

The IGBT is a device that uses the injected electron current as a base current to drive the pnp transistor formed of p-type well region 4, n-type drift layer 3 and p-type collector layer 2. The on-voltage of the IGBT has been reduced so far by increasing Z, by shortening L and by lowering Vth. The most popular way of reducing the on-voltage is to reduce the diffusion depth of the p-type well region so that the channel length L may be shortened.

Figure 12:
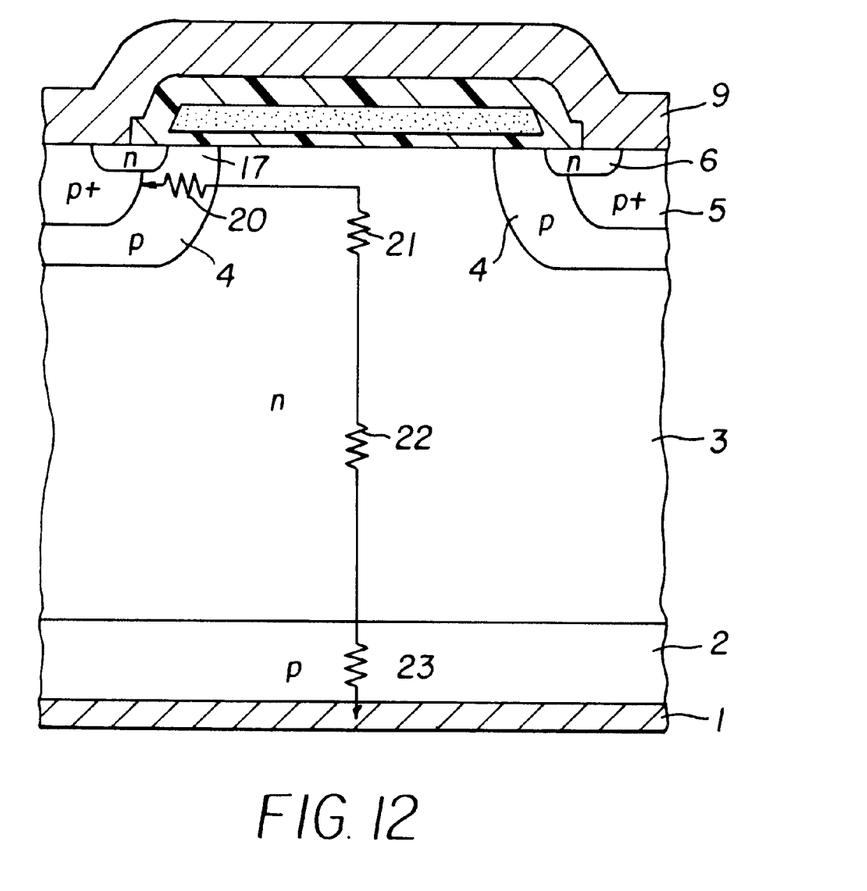
FIG. 12 is a cross sectional view for analyzing the on-voltage components in the IGBT.

FIG. 12 is a cross sectional view for analyzing the on-voltage components in the IGBT. Referring now to FIG. 12, the on-voltage of the IGBT consists of a voltage drop 20 across the channel resistance in a channel region 17 in the surface portion of p-type well region 4, a parasitic junction FET (JFET) component 21 formed of p-type well regions 4 and 4 on both sides and n-type drift layer 3, a voltage drop 22 in n-type drift layer 3, and a voltage drop 23 in p-type collector layer 2.

The reduction of the on-voltage by reducing the diffusion depth of p-type well region 4 is attributed to the reduction of the voltage drop 20 in channel region 17 and the reduction of the JFET component 21. Since the load short-circuit current is defined by the foregoing equation (1), the short circuit withstand capability in the short-circuiting of the load is reduced as the short-circuit current is larger.

It is important for the practical power device to exhibit a low on-voltage and a small short-circuit current. However, there exists a close relation between the on-voltage and the short circuit withstand capability. Shortening of the channel length by shallowly diffusing p-type well region 4 causes reduction of the short circuit withstand capability of the device, since the short diffusion depth of p-type well region 4, that lowers the on-voltage (reduces the loss), increases the short-circuit current.

Thus, it is substantially impossible for the foregoing countermeasures to independently control the channel length and the diffusion depth, i.e. the reduction of the on-voltage and the increase of the short-circuit current by shortening the channel length of the MOSFET and the reduction of the on-voltage by reducing the parasitic JFET component.

In view of the foregoing, it is an object of the invention to provide an IGBT that exhibits a low on-voltage and a sufficient short circuit withstand capability. It is another object of the invention to provide a method of manufacturing such an IGBT.

SUMMARY OF THE INVENTION

The invention providea an IGBT that exhibits a low on-voltage and a sufficient short circuit withstand capability and a method of manufacturing such an IGBT.

According to the invention, the well region of the second conductivity type and the emitter region of the first conductivity type are not formed by double diffusion using the gate electrode as a common mask. The well region and the emitter region are formed with a certain offset left beneath the gate electrode.

According to an aspect of the invention, there is provided an insulated gate transistor including: a lightly doped drift layer of a first conductivity type; a well region of a second conductivity type in the surface portion of the drift layer; an emitter region of the first conductivity type in the well region; a channel region in the extended portion of the well region extended between the emitter region and the drift layer; a gate electrode above the extended portion of the well region with a gate oxide film interposed therebetween; an emitter electrode in common contact with the well region and the emitter region; a collector electrode on the back surface of the drift layer; and an offset portion introduced into the extended portion of the well region to expand the width of the channel region.

The channel length is controlled by adjusting the width of the offset portion (offset length) and the diffusion depth is controlled independently of the channel length by adjusting the conditions for driving the channel region. The short-circuit current is reduced, that is, a certain short circuit withstand capability is secured, by expanding the channel length to some extent and the on-voltage is lowered by reducing the diffusion depth of the well region in the same insulated gate transistor.

According to another aspect of the invention, there is provided the method of manufacturing an insulated gate transistor, including a lightly doped drift layer of a first conductivity type, a well region of a second conductivity type in the surface portion of the drift layer, an emitter region of the first conductivity type in the well region, a channel region in the extended portion of the well region extended between the emitter region and the drift layer, a gate electrode above the extended portion of the well region with a gate oxide film interposed therebetween, an emitter electrode in common contact with the well region and the emitter region, and a collector electrode on the back surface of the drift layer, the method including: changing the effective mask edge location by an offset length between forming the well region and forming the emitter region to expand the width of the channel region.

The expanded width of the channel region, expanded by the offset length by the manufacturing method according to the invention, suppresses the JFET component of the on-voltage at a minimum value and secures a channel length long enough to obtain a certain short circuit withstand capability.

Preferably, the width of the offset portion (offset length) is from 0.5 to 5.0 $\mu$m. When the offset length is shorter than 0.5 $\mu$m, the short circuit withstand capability is small. When the offset length is longer than 5.0 $\mu$m, the on-voltage is too high. Therefore, the offset length outside the range between 0.5 $\mu$m and 5.0 $\mu$m is not practical.

The impurity concentration beneath the surface of the extended portion of the well region is preferably constant for the width of 0.5 $\mu$m or more.

According to the manufacturing method of the invention, the impurity concentration beneath the surface of the p-type well region is constant for the offset length. The region, therein the impurity concentration is constant, proves that the p-type well region and the n-type well region are offset from each other.

Preferably, different masks are used for implanting the impurity ions to form the p-type well region and to form the n-type emitter region. By using different masks, the p-type well region and the n-type well region are offset from each other easily. The masks, the thickness thereof is different, are used and the acceleration voltage is changed for implanting the impurity ions to form the p-type well region and to form the n-type emitter region.

Preferably, a common mask, the thickness thereof is tapered, is used for implanting the impurity ions to form the p-type well region and to form the n-type emitter region. The common mask is preferably made of polycrystalline silicon, the polycrystalline silicon mask is damaged by ion implantation, and the mask is provide with a tapered edge portion, formed by utilizing the etching rate difference between the polycrystalline silicon and the damaged layer. The polycrystalline silicon mask having a tapered edge portion facilitates offsetting the p-type well region and the n-type emitter region from each other.

According to still another aspect of the invention, there is provided a trench-type insulated gate transistor including: a lightly doped drift layer of a first conductivity type; a well region of a second conductivity type in the surface portion of the drift layer; an emitter region of the first conductivity type in the well region; a trench dug from the surface of the emitter region down to the drift layer; a channel region in the well region, the channel region facing to the trench, the thickness of the channel region being from 8 to 20 $\mu$m; a gate electrode above the surface of the channel region with a gate oxide film interposed therebetween; an emitter electrode in common contact with the well region and the emitter region; and a collector electrode on the back surface of the drift layer.

When the thickness of the channel region (channel length) is shorter than 8 $\mu$m, the short circuit withstand capability is small. When the channel length is longer than 20 $\mu$m, the on-voltage is too high. Therefore, the channel length outside the range between 8 $\mu$m and 20 $\mu$m is not practical for the trench-type insulated gate transistor.

Other features and advantages of the invention will become apparent to those of ordinary skill in the art from the following detailed description of the preferred embodiments of the invention and the accompanying drawings.

DETAILED DESCRIPTION OF THE PREFERRED EMBODIMENTS OF THE INVENTION

First Embodiment

Figure 1:
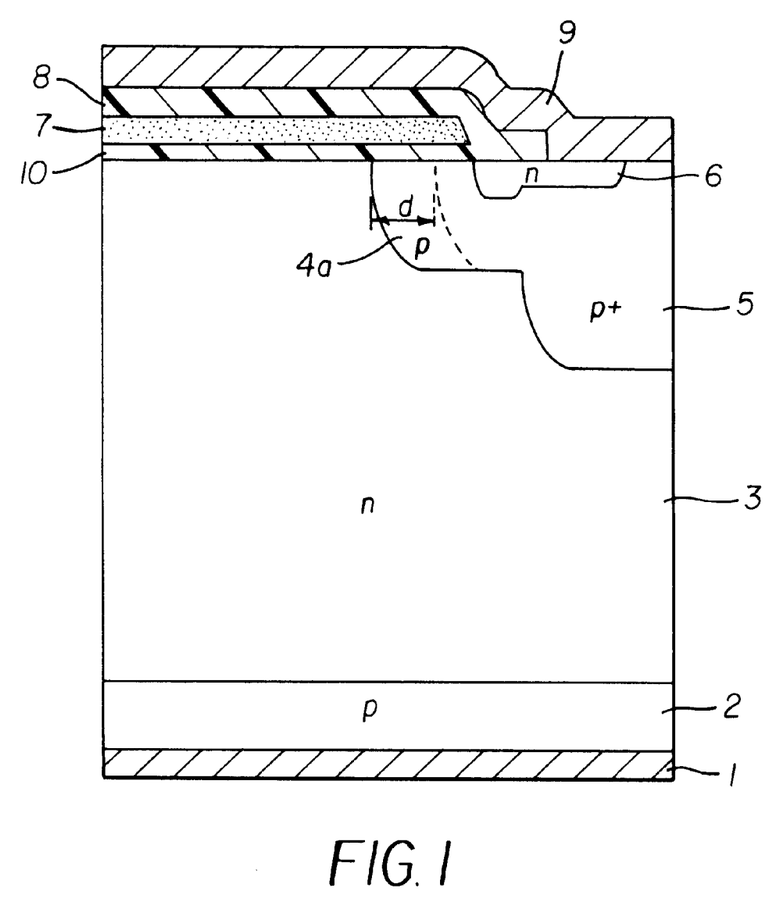
FIG. 1 is a cross sectional view of the unit structure (half cell) of an IGBT according to a first embodiment of the invention.

FIG. 1 is a cross sectional view of the unit structure (half cell) of an IGBT according to a first embodiment of the invention. Referring now to FIG. 1, a p-type well region 4a is in the surface portion of an n-type drift layer 3. An n-type emitter region 6 is in p-type well region 4a. A heavily doped p$^+$-type contact region 5 is in p-type well region 4a. A gate electrode 7 is above the semiconductor structure with a gate oxide film 10 interposed therebetween from n-type emitter region 6 to an n-type emitter region 6 in the adjacent unit structure. An emitter electrode 9 is in common contact with n-type emitter region 6 and p$^+$-type contact region 5. A collector electrode 1 is on a p-type collector layer 2 on the back surface of n-type drift layer 3. Emitter electrode 9 may be extended over gate electrode 7 with an interlayer insulation film 8 interposed therebetween. The junction depth of n-type emitter region 6 is different from portion to portion, since the junction depth is shallow in the portion of n-type emitter region 6 on heavily doped p$^+$-type contact region 5.

The IGBT shown in FIG. 1 is different from the IGBT shown in FIG. 10 in that the dose amount in p-type well region 4a is small, the diffusion depth of p-type well region 4a is shallow, and p-type well region 4a and n-type emitter region 6 are not self-aligned. The edge of p-type well region 4a is displaced beneath gate electrode 7 for an offset length d from the edge of gate electrode 7.

Figure 2A:
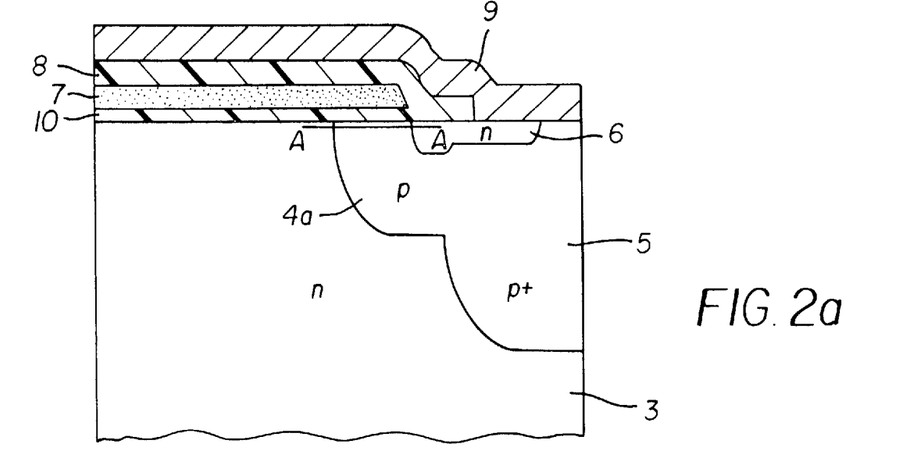
FIG. 2(a) is a cross sectional view of the IGBT according to the first embodiment showing the line A—A along that the impurity concentration is measured.
Figure 2B:
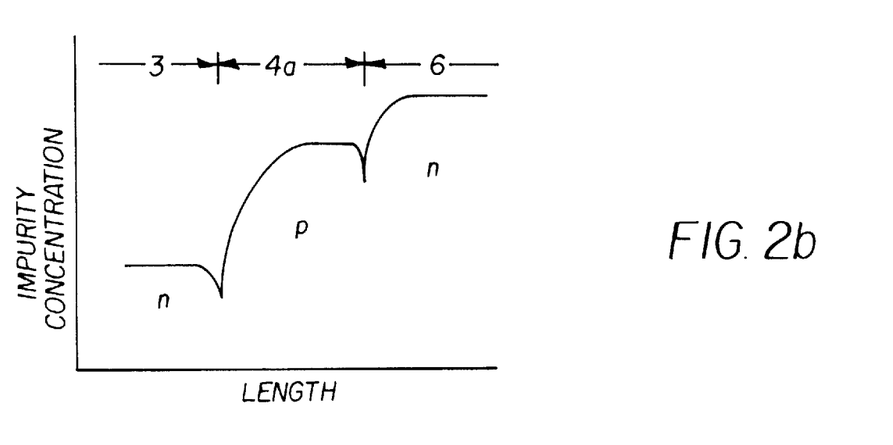
FIG. 2(b) shows an impurity concentration profile measured along the line A—A in FIG. 2(a).
Figure 2C:
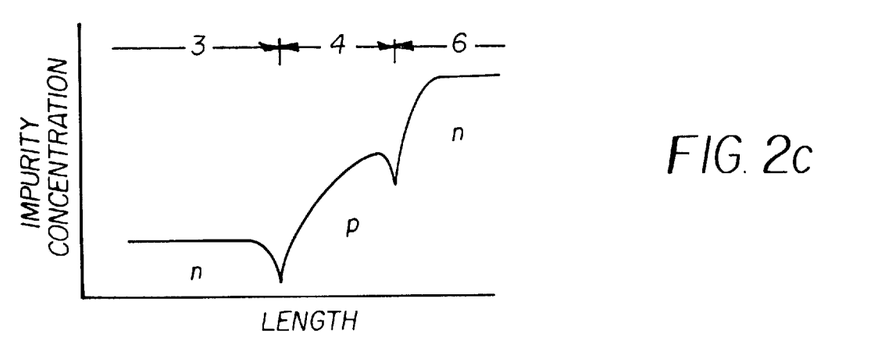
FIG. 2(c) shows an impurity concentration profile beneath the surface of the conventional IGBT.

FIG. 2(b) shows an impurity concentration profile measured along the line A—A in the IGBT according to the first embodiment shown in FIG. 2(a). FIG. 2(c) shows an impurity concentration profile beneath the surface of the conventional IGBT. In these figures, the vertical axis represents the logarithmic impurity concentration. The impurity concentrations are measured on an obliquely polished surface by the spreading resistance probe method.

The impurity concentrations exhibit different profiles in p-type well regions 4a and 4. In p-type well region 4 of the conventional IGBT, the impurity concentration decreases sharply from the edge of the gate electrode. In p-type well region 4a of the IGBT according to the invention, the impurity concentration remains at a certain value for the offset length d and, then, decreases sharply.

Figure 3A:
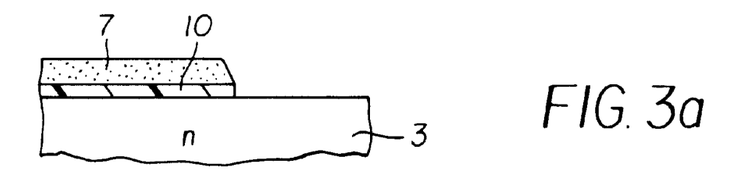
FIGS. 3(a)–(e) shows cross sectional views explaining the steps 3(a) through 3(e) for manufacturing the IGBT of FIG. 1.
Figure 3B:
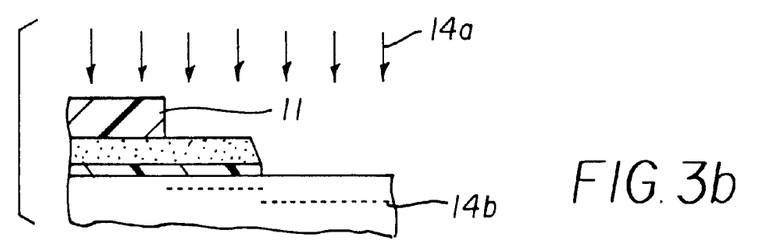
Figure 3C:
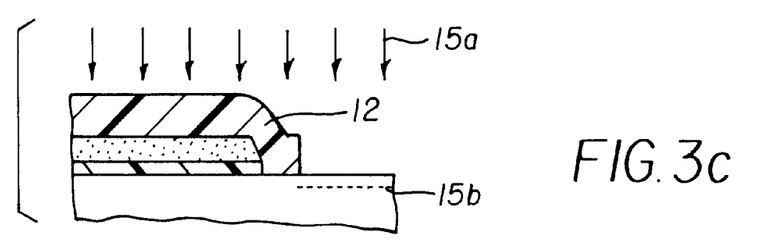
Figure 3D:
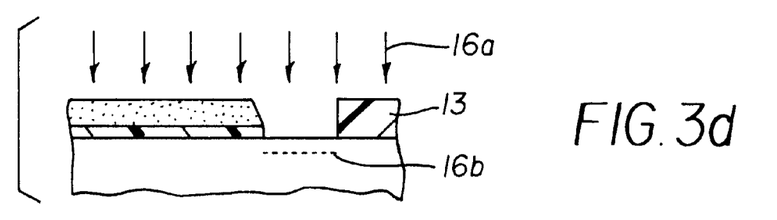
Figure 3E:
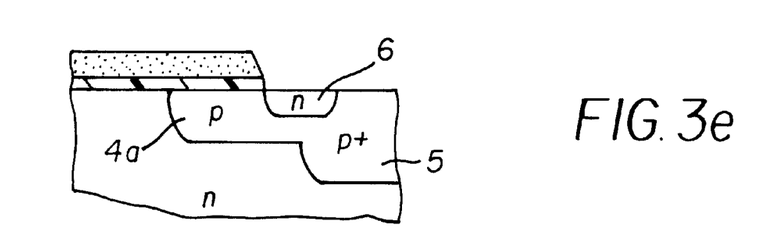

FIGS. 3(a)–3(e) show cross sectional views explaining the steps 3(a) through 3(e) for manufacturing the IGBT of FIG. 1. In the figures, only the emitter side of the IGBT is shown for the sake of simplicity. Referring now to FIG. 3(a), a thin gate oxide film 10 is formed on n-type drift layer 3 by thermal oxidation. A polycrystalline silicon film is deposited on gate oxide film 10 by the vacuum CVD method, and a gate electrode 7 is formed by patterning the deposited polycrystalline silicon film by photolithography. As shown in FIG. 3(b), boron ions 14a are implanted using a patterned photoresist 11 on gate electrode 7 as a mask under an acceleration voltage high enough to make boron ions 14a penetrate through gate electrode 7. The implanted boron atoms are designated by a reference numeral 14b. The boron ions are implanted shallowly through gate electrode 7. The dose amount is, for example, 5×10$^{13}$/cm$^3$, that is smaller than the dose amount for the conventional manufacturing process explained with reference to FIG. 11. Referring now to FIG. 3(c), photoresist 11 is removed and, then, boron ions 15a are implanted using a patterned photoresist 12 for forming p$^+$-type contact region 5. The implanted boron atoms are designated by a reference numeral 15b. As shown in FIG. 3(d), photoresist 12 is removed and, then, arsenic ions 16a are implanted using gate electrode 7 and a patterned photoresist 13 as masks for forming n-type emitter region 6 (under a low acceleration voltage). The implanted arsenic atoms are designated by a reference numeral 16b. Referring now to FIG. 3(e), p-type well region 4a, p$^+$-type contact region 5 and n-type emitter region 6 are formed by activating the implanted boron atoms 14b and 15b and the implanted arsenic atoms 16b by a heat treatment. According to the manufacturing method described above, p-type well region 4a and n-type emitter region 6 are not perfectly self-aligned. However, p-type well region 4a and n-type emitter region 6 may be half self-aligned based on that the spacing between the edge of p-type well region 4a and the edge of n-type emitter region 6 is determined by the thickness of photoresist 11 and the acceleration voltage for implanting boron ions 14a. The offset length is observable visually after patterning.

In the IGBT with the breakdown voltage of the 600 V class, the diffusion depth is 1.5 μm for p-type well region 4a, 3 μm for p⁺-type contact region 5 and 0.3 μm for n-type emitter region 6. The offset length of p-type well region 4a is 1 μm. Since the channel length for the self-aligned p-type well region 4 and n-type emitter region 6 is about 0.4 μm, the channel length in the IGBT according to the first embodiment is about 1.4 μm.

Figure 4:
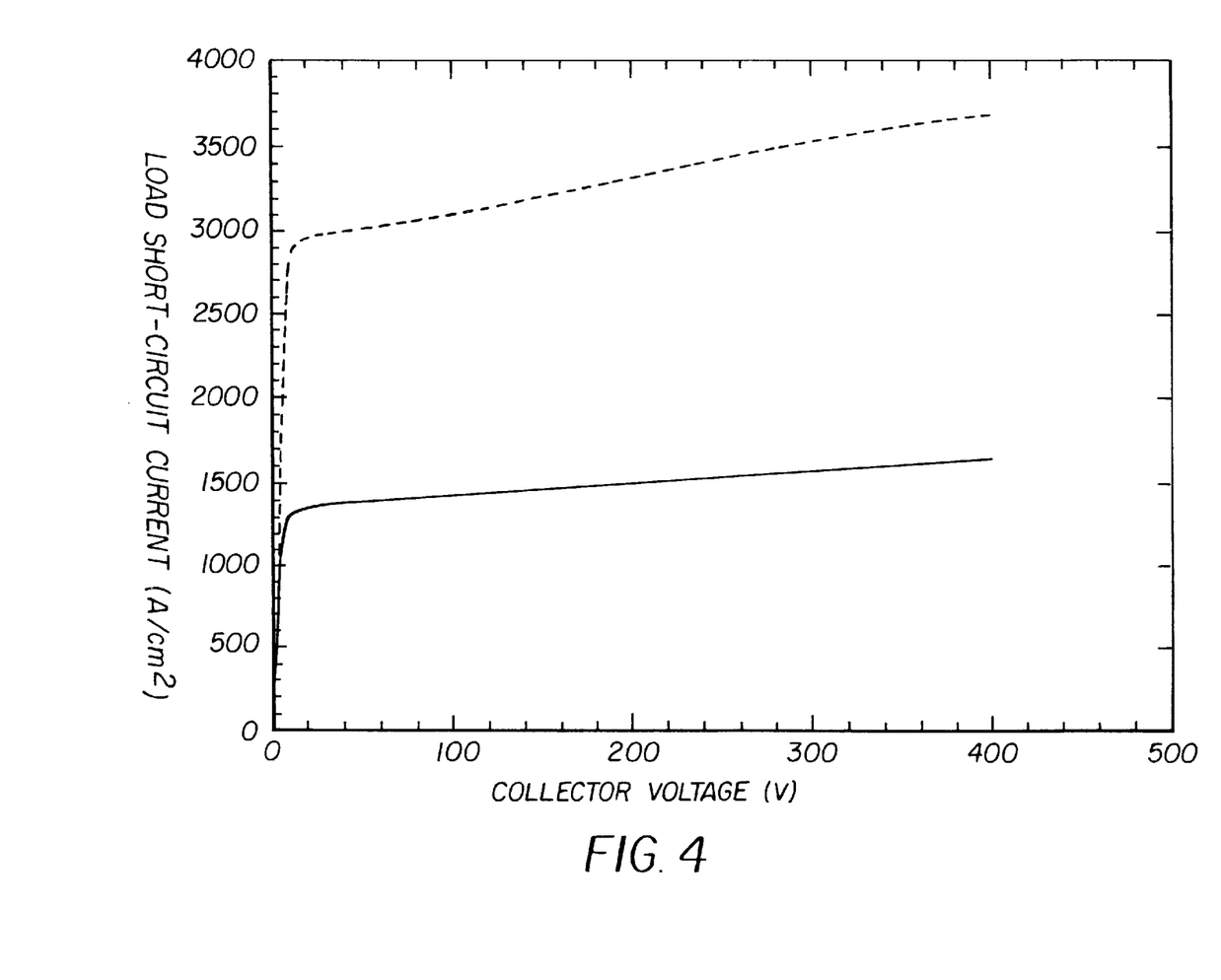
FIG. 4 shows a pair of curves for comparing the voltage dependence of the collector current in the load short-circuit at the diffusion depth of the p-type well region of 1.5 μm and the offset length of 1 μm in the present IGBT exhibiting the breakdown voltage of the 600 V class with that of the conventional IGBT having the same channel length.

FIG. 4 shows a pair of curves comparing the voltage dependence of the collector current in the load short-circuit at the diffusion depth of p-type well region 4a of 1.5 μm and the offset length of 1 μm in the IGBT exhibiting the breakdown voltage of the 600 V class with that of the conventional IGBT having the same channel length. The load short-circuit current at the collector voltage of 400 V is 1650 A/cm² for the present IGBT, that is less than half the load short-circuit current of 3700 A/cm² for the conventional IGBT.

Figure 5:
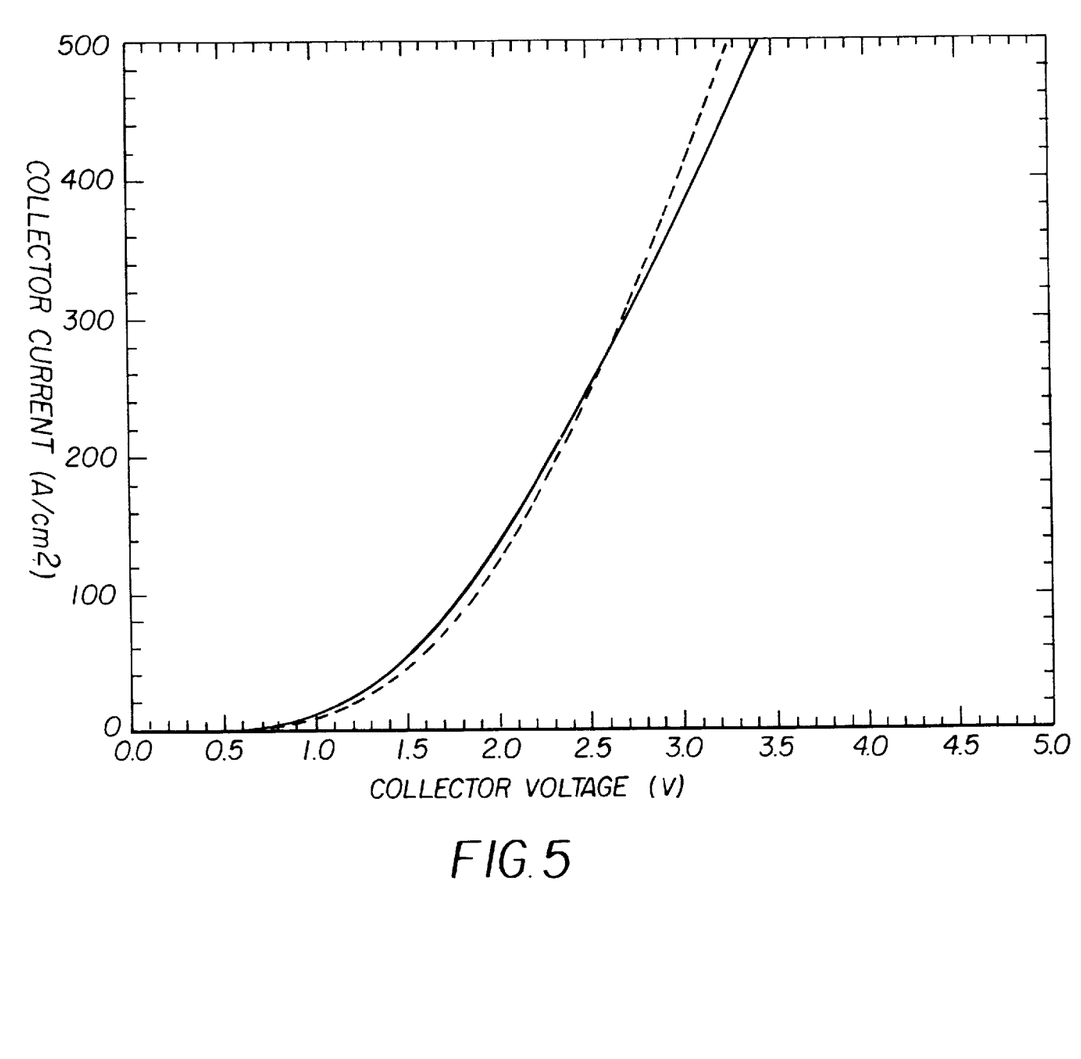
FIG. 5 shows a pair of curves relating the collector current with the collector voltage for the IGBT according to the first embodiment and the conventional IGBT.

FIG. 5 shows a pair of curves relating the collector current with the collector voltage for the IGBT according to the first embodiment and the conventional IGBT. At the current density of 250 A/cm² or less, the on-voltage of the IGBT according to the first embodiment is lower than the on-voltage of the conventional IGBT. The lower on-voltage is realized by the JFET component reduced by diffusing p-type well region 4a more shallowly than p⁺-type contact region 5.

Figure 6:
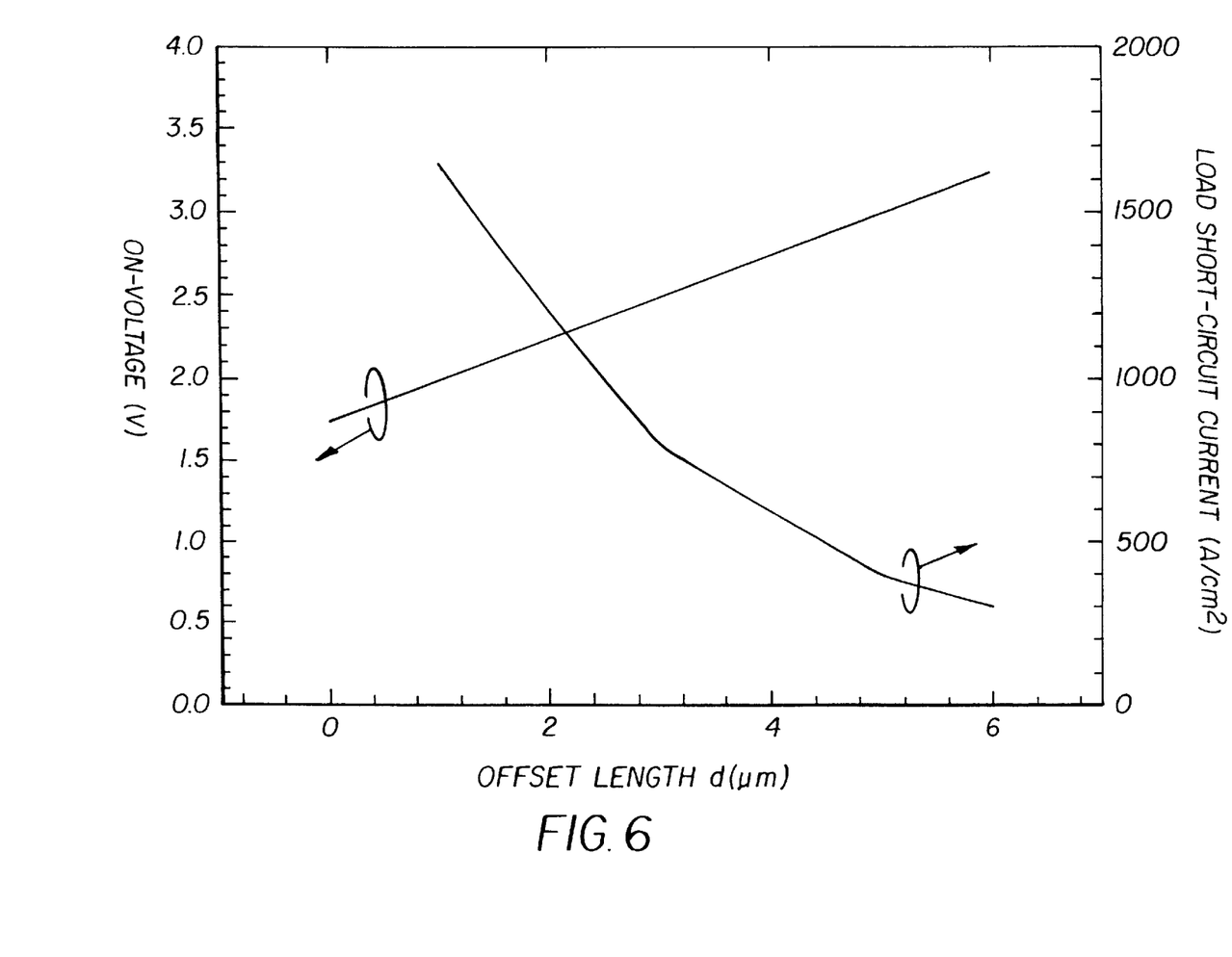
FIG. 6 shows a pair of curves relating the on-voltage and the short-circuit current with the offset length the same diffusion depth of the p-type well region.

FIG. 6 shows a pair of curves relating the on-voltage and the short-circuit current with the offset length at the same diffusion depth of the p-type well region. Although it depends whether one attaches greater importance to the on-voltage or the short circuit withstand capability, a favorable result is obtained at the offset length of from 0.5 to 5.0 μm. Although the on-voltage is low at the offset length of less than 0.5 μm, the load short-circuit current is too large. At the offset length of 0.5 μm or more, the load short-circuit current is small enough to obtain the desired short circuit withstand capability of 10 μsec or more. Although the load short-circuit current is small at the offset length of more than 5.0 μm, the on-voltage is more than 3.0 V, that is practically too high.

The steps 3(a) through 3(e) are not the only solution for manufacturing the IGBT according to the invention. For example, the step 3(b) and the step 3(c) are interchangeable. Various variations are possible within the scope of the invention.

Second Embodiment

Figure 7A:
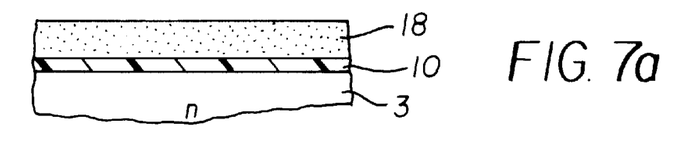
FIG. 7 shows cross sectional views explaining the steps 7(a) through 7(g) for manufacturing an IGBT according to a second embodiment of the invention.
Figure 7B:
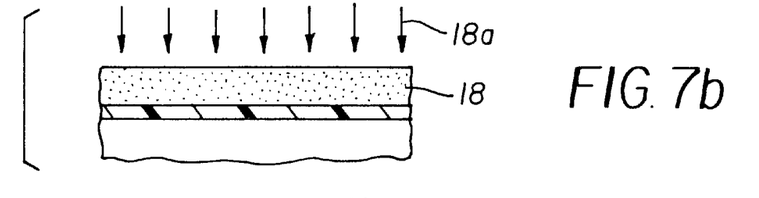
Figure 7C:
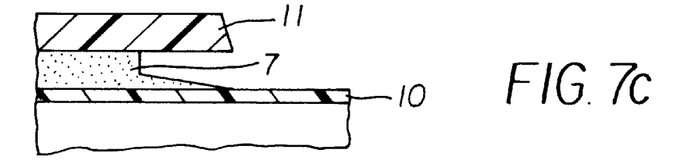
Figure 7D:
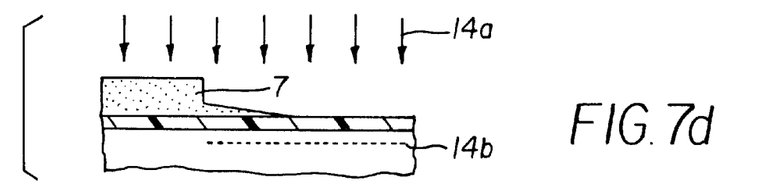
Figure 7E:
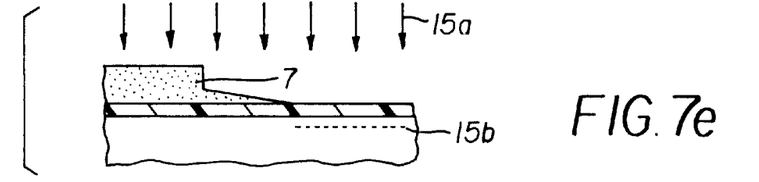
Figure 7F:
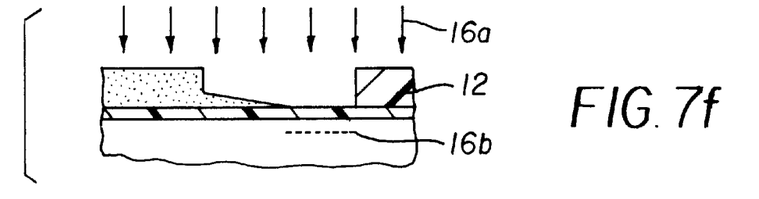
Figure 7G:
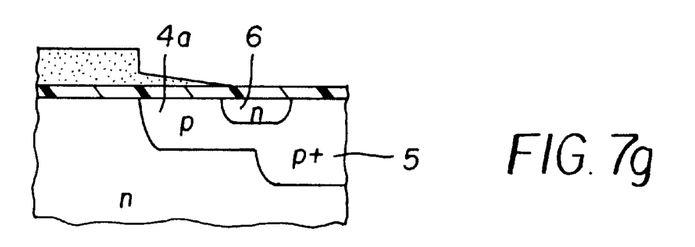

FIGS. 7(a)–7(g) shows cross sectional views explaining the steps 7(a) through 7(g) for manufacturing an IGBT according to a second embodiment of the invention. In FIG. 7, only the emitter side of the IGBT is shown for the sake of simplicity. Referring now to FIG. 7(a), a thin gate oxide film 10 is formed on n-type drift layer 3 by thermal oxidation. A polycrystalline silicon film 18 is deposited on gate oxide film 10 by the CVD method. As shown in FIG. 7(b), boron ions 18a are implanted in polycrystalline silicon film 18 under an acceleration voltage low enough to stop the implanted boron atoms within the surface portion of polycrystalline silicon film 18 so that a damaged layer may be formed in the surface portion of polycrystalline silicon film 18. Other ions may be used in substitution for the boron ions for forming the damaged layer. Referring now to FIG. 7(c), a photoresist 11 is coated on polycrystalline silicon film 18. After pattering photoresist 11, a gate electrode 7 is formed by etching polycrystalline silicon film 18. Since the damaged layer is etched more quickly, gate electrode 7 has a cross section as shown in the figure. As shown in FIG. 7(d), after removing photoresist 11, boron ions 14a are implanted using gate electrode 7 as a mask under an acceleration voltage high enough to make the boron ions penetrate through the thin portion of gate electrode 7. The implanted boron atoms are designated by a reference numeral 14b. Referring to FIG. 7(e), boron ions 15a are implanted using gate electrode 7 as a mask under a low acceleration voltage. The implanted boron atoms are designated by a reference numeral 15b. As shown in FIG. 7(f), arsenic ions 16a are implanted using gate electrode 7 and a patterned photoresist 12 as masks under a low acceleration voltage. The implanted arsenic atoms are designated by a reference numeral 16b. Referring now to FIG. 7(g), a p-type well region 4a, a p⁺-type contact region 5 and an n-type emitter region 6 are formed by activating implanted boron atoms 14b and 15b and implanted arsenic atoms 16b by a heat treatment. It is considered that p-type well region 4a and n-type emitter region 6 are half self-aligned by the manufacturing method according to the second embodiment, since the edge of p-type well region 4a and the edge of n-type emitter region 6 are displaced by the slant angle determined by the etching speed of the damaged layer in polycrystalline silicon film 18.

By the manufacturing method according to the second embodiment, p-type well region 4a having an offset portion and n-type emitter region 6 are formed with excellent reproducibility without changing the conventional manufacturing process so much.

Third Embodiment

Figure 8:
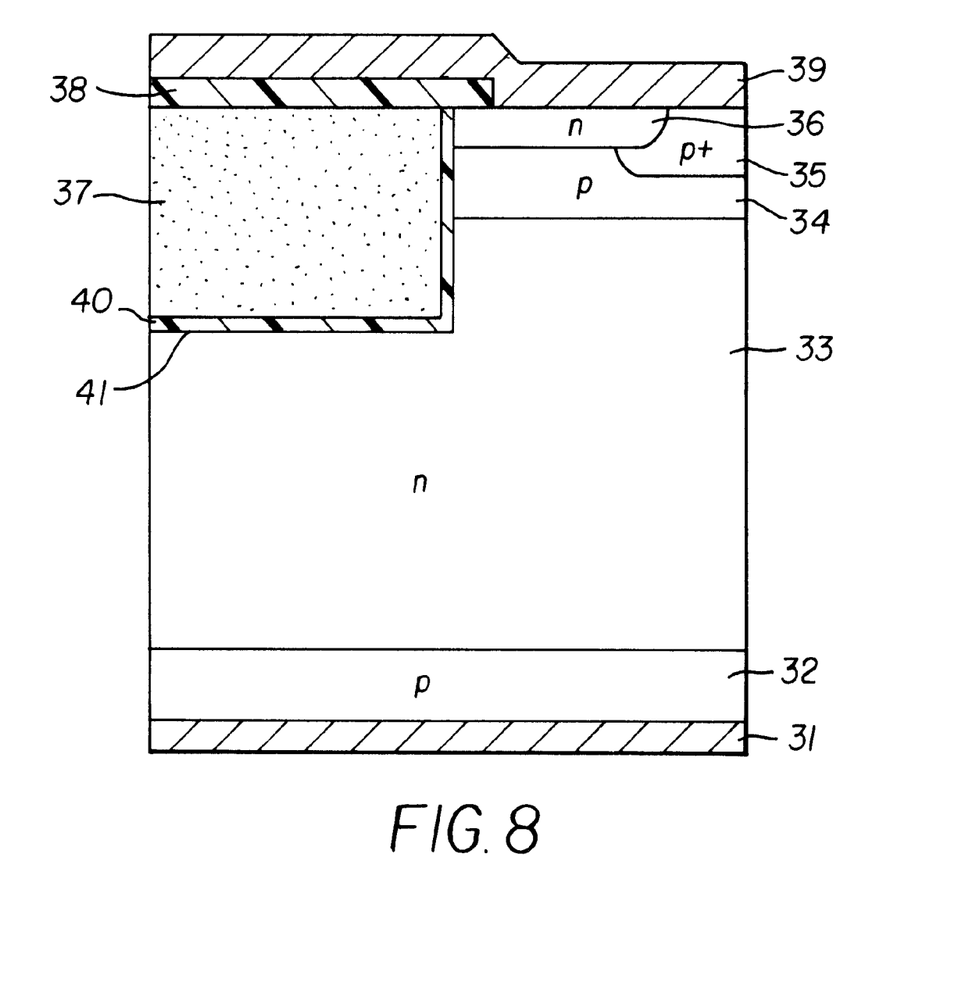
FIG. 8 is a cross sectional view of the unit structure (half cell) of a trench-type IGBT according to a third embodiment of the invention.

The present invention is applicable to trench-type IGBT's. FIG. 8 is a cross sectional view of the unit structure (half cell) of a trench-type IGBT according to a third embodiment of the invention. Referring now to FIG. 8, a p-type well region 34 is in the surface portion of an n-type drift layer 33. An n-type emitter region 36 is in p-type well region 34. A heavily doped p⁺-type contact region 35 is in the surface portion of p-type well region 34. A trench 41 is dug from the surface of n-type emitter region 36 down to n-type drift layer 33. A gate electrode 37 is buried in trench 41 with a gate oxide film 40 interposed therebetween. An emitter electrode 39 is in common contact with n-type emitter region 36 and p⁺-type contact region 35. A p-type collector layer 32 is on the back surface of n-type drift layer 33. A collector electrode 31 is on p-type collector layer 32. In this trench-type IGBT, the thickness of p-type well region 34 facing to trench 41 is the channel length.

Figure 9:
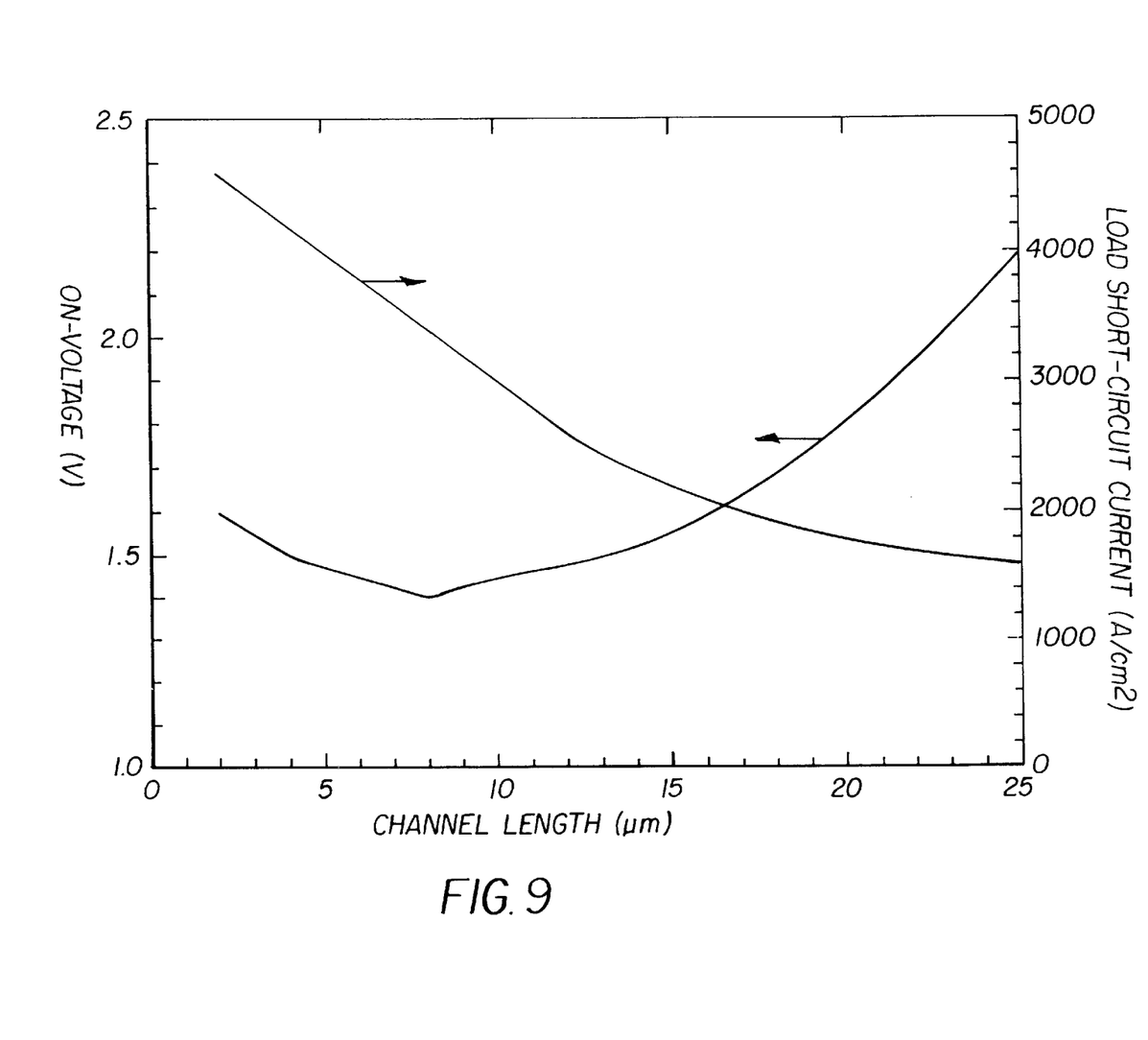
FIG. 9 shows a pair of curves relating the on-voltage and the short-circuit current with the channel length in the trench-type IGBT of FIG. 8.

FIG. 9 shows a pair of curves relating the on-voltage and the short-circuit current with the channel length in the trench-type IGBT of FIG. 8. Although it depends whether one attaches greater importance to the on-voltage or the short circuit withstand capability, a favorable result is obtained at the channel length of from 8 to μm.

Although the on-voltage is low at the channel length of less than 8 μm, the load short-circuit current is too large. At the channel length of 8 μm or more, the load short-circuit current is small enough to obtain the desired short circuit withstand capability of 10 μsec or more. Although the load short-circuit current is small at the channel length of more than 20 μm, the on-voltage is more than 3.0 V, that is practically too high.

Although the invention has been explained in connection with the IGBT's, the invention is applicable to MOSFET's by changing the emitter and the collector to a source and a drain, respectively. The invention is applicable also to insulated gate thyristors.

In the insulated gate transistor according to the invention, the parasitic JFET effect is suppressed and the load short-circuit current is reduced by controlling the diffusion depth of the well region of the second conductivity type and the channel length independently. The on-voltage of the insulated gate transistor is reduced by the suppression of the parasitic JFET effect and the short circuit withstand capability thereof is improved by the reduction of the load short-circuit current.

Although it depends whether one attaches greater importance to the on-voltage or the short circuit withstand capability, a favorable result is obtained at the offset length of from 0.5 to 5.0 μm between the well region of the second conductivity type and the emitter region of the first conductivity type in the insulated gate transistor. A favorable result is obtained at the thickness of from 8 to 20 μm of the well region of the second conductivity type in the trench-type insulated gate transistor.

The present invention facilitates reducing the loss of the power devices for high power use and improving the efficiency of the electric power conversion apparatuses. Modifications and variations are possible within the scope of the appended claims.

What is claimed is:

1. An insulated gate transistor comprising:

a lightly doped drift layer of a first conductivity type;

a well region of a second conductivity type in the surface portion of the drift layer having a first diffusion depth;

an emitter region of the first conductivity type in the well region;

an extended portion of the well region, which is extended beyond the emitter region, formed along the surface portion of the drift layer, and having a second diffusion depth which is shallower than that of the first depth;

a channel region in the extended portion of the well region extended between the emitter region and the drift layer;

a gate electrode above the extended portion of the well region with a gate oxide film interposed therebetween;

an emitter electrode in common contact with the well region and the emitter region;

a collector electrode on the back surface of the drift layer; and an offset portion introduced into the extended portion of the well region for expanding the width of the channel region, wherein the width of the offset portion is from 0.5 to 5.0 μm, and wherein the impurity concentration beneath the surface of the extended portion of the well region is constant for the width of 0.5 μm or more.

2. An insulated gate transistor comprising:

a lightly doped drift layer of a first conductivity type;

a well region of a second conductivity type in the surface portion of the drift layer having a first diffusion depth;

an emitter region of the first conductivity type in the well region;

an extended portion of the well region which is extended beyond the emitter region, is formed along the surface portion of the drift layer, and has a second diffusion depth which is shallower than that of the first depth;

a channel region in the extended portion of the well region extended between the emitter region and the drift layer;

a gate electrode above the extended portion of the well region with a gate oxide film interposed therebetween;

an emitter electrode in common contact with the well region and the emitter region;

a collector electrode on the back surface of the drift layer; and an offset portion introduced into an extended portion of the well region, whereby to expand the width of the channel region;

wherein the impurity concentration beneath the surface of the extended portion of the well region is constant for a width of 0.5 μm or more.

* * * * *